United States Patent
Shimizu

[11] Patent Number: 6,089,377
[45] Date of Patent: Jul. 18, 2000

[54] SEMICONDUCTOR WAFER CARRIER

[75] Inventor: Yuji Shimizu, Tokyo, Japan

[73] Assignee: NEC Corporation, Tokyo, Japan

[21] Appl. No.: 08/910,673

[22] Filed: Aug. 13, 1997

[30] Foreign Application Priority Data

Aug. 26, 1996 [JP] Japan ................................. 8-223965

[51] Int. Cl.⁷ .................................................. B05C 13/02
[52] U.S. Cl. ........................ 206/711; 118/500; 206/832; 211/41.18
[58] Field of Search ................................. 118/500, 502; 211/41.18; 206/454, 832, 833, 710, 711; 432/258, 259, 261

[56] References Cited

U.S. PATENT DOCUMENTS

| | | | |
|---|---|---|---|
| 3,934,733 | 1/1976 | Worden | 206/832 |
| 4,676,008 | 6/1987 | Armstrong | 206/454 |
| 4,872,554 | 10/1989 | Quernemoen | 206/454 |
| 4,966,549 | 10/1990 | Ohdate | 432/258 |
| 5,000,795 | 3/1991 | Chung et al. | 134/37 |
| 5,054,418 | 10/1991 | Thompson et al. | 188/500 |
| 5,379,785 | 1/1995 | Ohmori et al. | 134/184 |
| 5,672,212 | 9/1997 | Manos | 134/1.3 |

Primary Examiner—Jim Foster
Attorney, Agent, or Firm—J. Warren Whitesel; Laff, Whitesel & Saret

[57] ABSTRACT

The invention provides a boat-type semiconductor wafer carrier which prevents such a situation that, upon wet processing of semiconductor wafers, the wafers carried thereon are displaced from grooves thereof and inclined until they fall down or contact with each other to break themselves or damage the surfaces of them. A holding member for holding down upper portions of the wafers is mounted on the boat-type carrier, and the wafer holding member is removable from the boat-type carrier, and is mounted onto the boat-type carrier to fix the wafers aligned on the boat-type carrier. Transportation of the wafers between processing tanks is performed by transporting the boat-type carrier on which the wafers are carried.

9 Claims, 5 Drawing Sheets

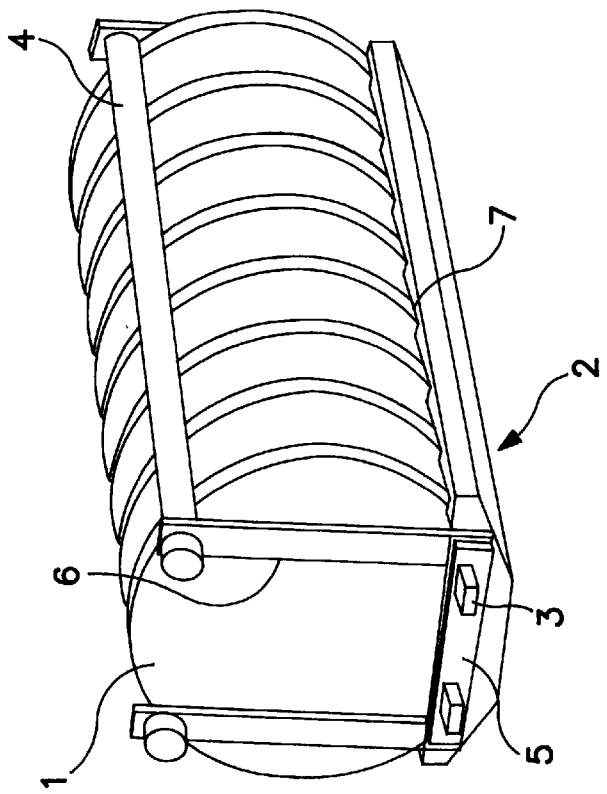
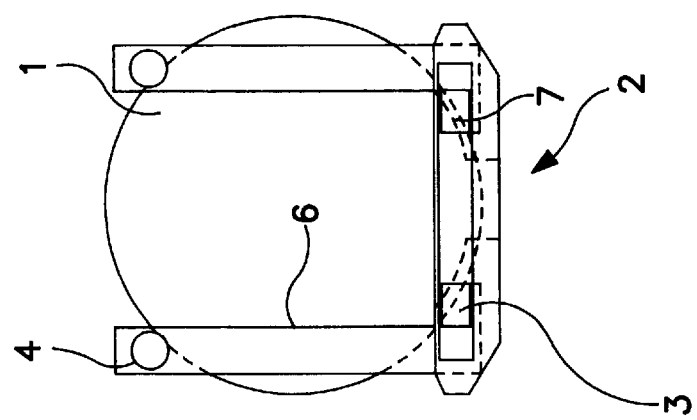
FIG. 2a
FIG. 2b

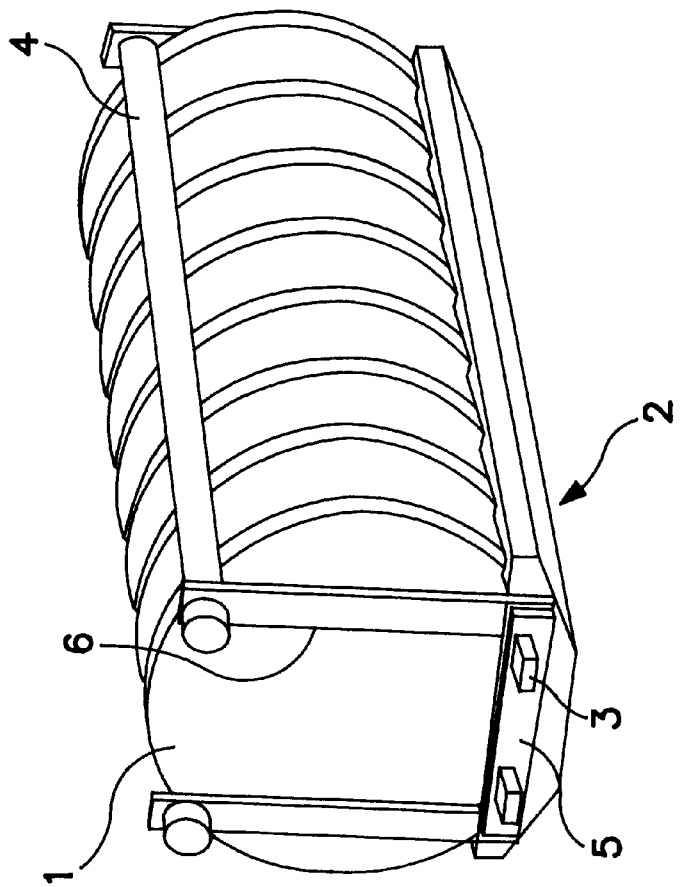
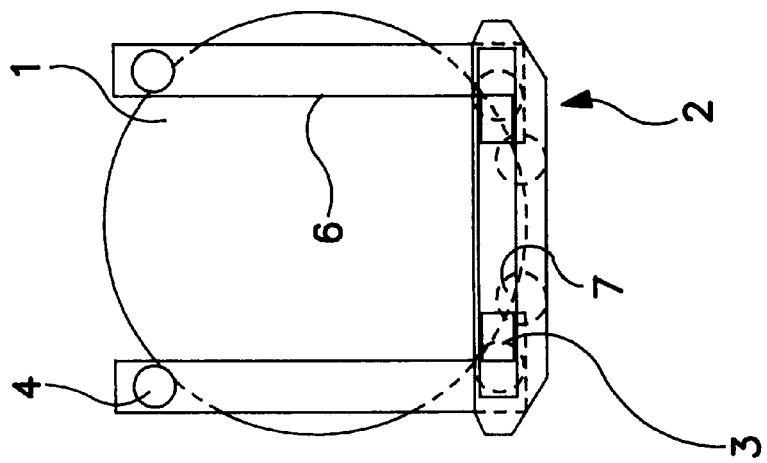
FIG. 3b
FIG. 3a

SEMICONDUCTOR WAFER CARRIER

BACKGROUND OF THE INVENTION

1. Field of the Invention

This invention relates to a wet processing for a semiconductor wafer, and more particularly to a carrier for a semiconductor wafer for use for a wet processing.

2. Description of the Prior Art

For a batch type wet processing for a semiconductor wafer (hereinafter referred to as a wafer), there is a carrier system wherein wafers are accommodated in a carrier and immersed into a processing tank and a carrierless system wherein only wafers are immersed into a processing tank without using a carrier. In the carrierless system, a boat for supporting wafers is provided at the bottom of a processing tank, and a robot for holding and transporting wafers between processing tanks accommodates the wafers into the boat in the tank.

Advantages and disadvantages of the two systems are described below. In the carrier system, transportation between processing tanks is performed by a robot which holds a carrier in which wafers are accommodated, and the wafers do not contact directly with the robot. Consequently, in the carrier system, a damage of a wafer such as a crack or a break caused by a failure in holding by the carrier is less likely to occur. Further, since adjustment of the position when a wafer is immersed into a processing tank is performed by adjustment of the position of the carrier, the carrier system is advantageous in that a comparatively large tolerance can be provided to the position. However, the carrier system is disadvantageous in that, since wafers are immersed into a processing tank while they are kept accommodated in the carrier, a large capacity is required for the processing tank and this increases an amount of chemicals to be used and increases the size of the apparatus.

On the other hand, the carrierless system is advantageous in that, since only wafers are immersed into a processing tank, the capacity of the processing tank can be made smaller than that of the carrier system and this allows reduction of the amount of medicals to be used and reduction of the size of the apparatus. However, the carrierless system is disadvantageous in that, since wafers are directly held and transported by a transport robot, damage of wafers such as cracks or breaks caused by failures in holding of wafers by the robot occurs more frequently than that in the carrier system, and the adjustment of the positions of the transport robot and the boat provided in the processing tank must be performed accurately so that wafers may be accommodated into grooves of the boat, and besides such position adjustment must be performed periodically.

As a system which makes up for the drawbacks of the carrier system and the carrierless system described above, a system which employs a carrier of the boat-type (herein after referred to as a boat-type carrier) has been proposed. In this system, as shown in FIG. 1, wafers are carried on a boat-type carrier and a transport robot holds the boat-type carrier to effect transportation between processing tanks. This system is advantageous in that, since the width of the carrier can be made smaller than the diameter of wafers, the capacity of processing tanks can be reduced comparing with that of the carrier system, and since the transportation between the processing tanks is performed while wafers are accommodated in the carrier, there is no necessity for accurate adjustment of the positions of the transport robot and the boat.

While the system which employs a boat-type carrier has the advantages of both of the carrier system and the carrierless system as described above, it has the following problems.

Production of a semiconductor has a step of processing a wafer with liquid which is a mixture of sulfuric acid and hydrogen peroxide solution (Sulfuric acid Hydrogen-Peroxide Mixture, hereinafter referred to as SPM) in order to remove photo resist used in a lithography process from the wafer. The specific gravity of sulfuric acid is as heavy as 1.83 (20° C.) where the concentration of it is 96% by weight, and since SPM is usually used at a temperature higher than 100° C., a large amount of gas bubbles are produced by decomposition of the hydrogen peroxide solution. If wafers are immersed into the SPM in this state, then gas bubbles stick to the wafers, and the wafers sometimes float a little because of an influence of the gas bubbles and the specific gravity of the SPM.

In the system which employs a boat-type carrier, since holding of wafers by the carrier is conventionally performed only by grooves of the carrier which hold the bottoms of the wafers, even if the wafers float a little, they are removed from the grooves of the carrier. Then, if the boat-type carrier is taken away from the processing tank while the wafers are being removed from the grooves, such a problem occurs that the wafers fall down to break themselves or contact with adjacent wafers to break the surfaces of the wafers.

Further, not only upon processing of wafers with medicals, but also upon rinsing with pure water after such processing with medicals, a different problem arises. As a system for rinsing with pure water after processing with medicals, there is a system wherein pure water in a rinse tank is drained in a short time after wafers are placed into the rinse tank in order to raise the rinsing effect. In this system, since pure water in the tank is removed suddenly, the flow rate of the pure water in the tank is high. When wafers accommodated in the boat-type carrier are immersed into the rinse tank of this system, such a situation occurs sometimes that the wafers are inclined by the force of the flow of the pure water so that they contact with each other to damage the surfaces of them.

SUMMARY OF THE INVENTION

It is an object of the present invention to provide a boat-type semiconductor wafer carrier which may prevent such a situation that, upon wet processing of semiconductor wafers, the wafers carried thereon are displaced from the grooves thereof and inclined until they fall down or contact with each other to break themselves or damage the surfaces of them.

To achieve the above object, there is provided a semiconductor wafer carrier of the boat-type which comprises holding means for holding down the upper portions of the semiconductor wafers to fix the semiconductor wafers on the semiconductor wafer carrier.

The holding means may include at least one holding member for holding down all of the semiconductor wafers carried on the semiconductor wafer carrier to fix the semiconductor wafers.

The holding member may be removable from the semiconductor wafer carrier.

The holding member may be in the form of a rod having a circular cross section.

The holding member may have a plurality of grooves for fixing the semiconductor wafers therein.

The holding member may have projections each formed between adjacent grooves thereof for accelerating removal of liquid.

Preferably, the holding member for holding bottom portions of the semiconductor wafers on the body of the carrier is in the form of a rod having a circular cross section and has a plurality of grooves for fixing the bottom portions therein.

Preferably, the semiconductor wafer carrier has a height smaller than the radius of the semiconductor wafers to be carried on the semiconductor wafer carrier and has a width equal to or smaller than the diameter of the semiconductor wafers.

Preferably, the semiconductor wafer carrier and the holding means are made of quartz or a Teflon type resin such as PFA or PTFE. "Teflon" is a trademark for a synthetic fluorine-containing resin, one example of which is tetrafluoroethene.

BRIEF DESCRIPTION OF THE DRAWINGS

FIGS. 2(a), (b) are a front elevational view and a perspective view showing a general construction of a boat-type semiconductor wafer carrier of a first embodiment of the present invention;

FIGS. 3(a), (b) are a front elevational view and a perspective view showing a general construction of a boat-type semiconductor wafer carrier of a second embodiment of the present invention;

DESCRIPTION OF THE PREFERRED EMBODIMENTS

Figure 1B:
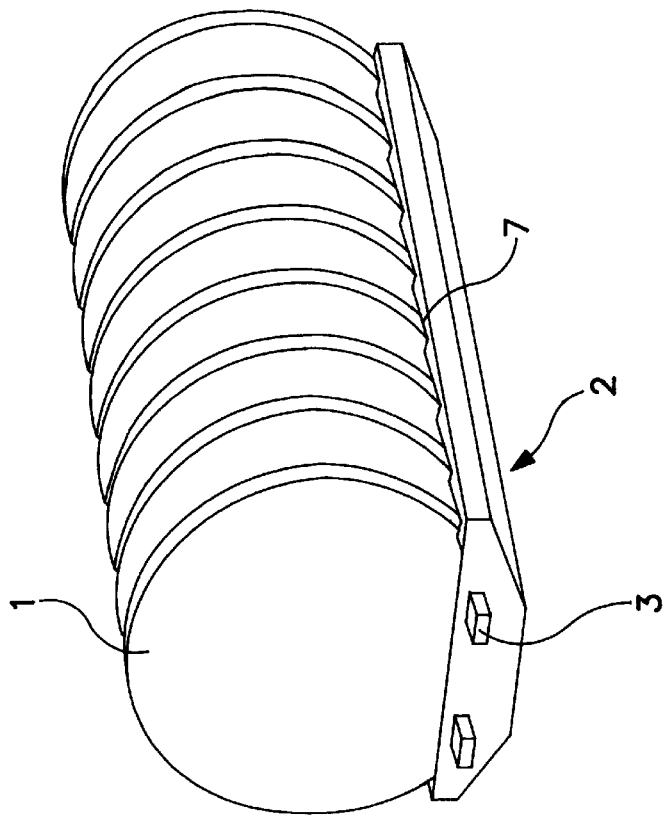
FIGS. 1(a), (b) are a front elevational view and a perspective view showing a general construction of a conventional boat-type carrier.
Figure 1A:
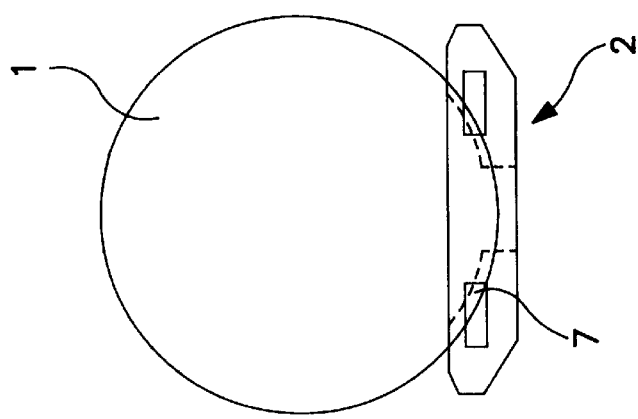

Next, embodiments of the present invention are described with reference to the drawings. FIGS. 2(a), (b) and FIGS. 3(a), (b) are front elevational views and perspective views, respectively, showing general constructions of boat-type semiconductor wafer carriers of the embodiments of the present invention.

The boat-type carrier shown in FIGS. 2(a), (b) is denoted by 2 and has a pair of wafer holding members 4 mounted thereon by means of a pair of auxiliary members 6, and a plurality of wafers 1 are held down on boat-type carrier 2 by two wafer holding members 4 such that the wafers are aligned with each other with surfaces thereof arranged in parallel to each other. It is to be noted that wafer holding members 4 are individually removable from boat-type carrier 2. The positions at which wafer holding members 4 contact with wafers 1 are vertically higher than the centers of the wafers, and the width or distance between the two wafer holding members 4 is set shorter than the diameter of the wafers. By placing wafers 1 in a mutually aligned relationship on boat-type carrier 2 and fixing wafers 1 by wafer holding members 4 and then attaching fastening members 5, mounting of wafers 1 onto boat-type carrier 2 is completed. The boat-type carrier for which the mounting has been completed is held at moving robot holding elements 3 thereof and transported by a transport robot (not shown) between processing tanks (not shown).

The boat-type carrier shown in FIGS. 3(a), (b) is different from the carrier of FIGS. 2(a), (b) in that the portions of the boat-type carrier at which the bottom portions of the wafers contact have rod-like profiles, and the opening rate of the bottom of the boat-type carrier becomes remarkably higher comparing with that of the boat-type carrier of FIGS. 2(a), (b). Since the opening rate of the bottom of the boat-type carrier becomes higher, flows of processing solution and rinsing solution in a tank make laminar flows, and there is an advantage in that the uniformity of the surfaces of wafers and the rinsing efficiency are improved remarkably. The uniformity of wafer surfaces and the improvement in rinsing effect provide further advantage that the operation efficiency of a washing apparatus is improved and a larger number of wafers can be processed.

Figure 4:
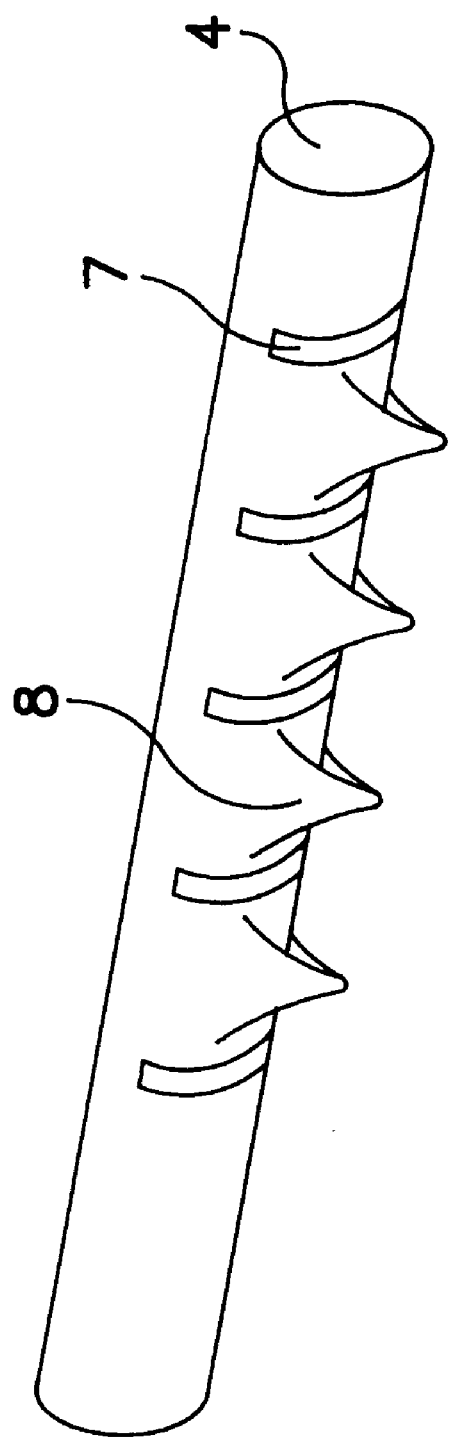
FIG. 4 is a partial enlarged view of a wafer holding member.

FIG. 4 is a partial enlarged view of one of the wafer holding members 4. Projection 8 for accelerating removal of liquid is mounted between adjacent grooves 7 of wafer holding members 4 in which wafers are to be secured. Thus, when boat-type carrier 2 is drawn up from a processing tank after medical processing and rinsing processing are performed, liquid sticking to wafer holding members 4 drops from projections 8 passing between adjacent surfaces of the wafers. Consequently, the dropping liquid does not stick to the surfaces of the wafers, and sticking of dust to or production of stains on the wafer surfaces is suppressed.

Next, a processing method when wet processing is performed using the boat-type carrier shown in FIGS. 2(a), (b) or 3(a), (b) is described by way of an example wherein resist formed as a film on the surface of a wafer is removed using SPM.

Wafers 1 on which photo resist is formed as films are placed onto boat-type carrier 2 for wet processing, fixing the bottoms of the wafers by the grooves of the carrier body. Then, two wafer holding members 4 are mounted onto boat-type carrier 2 using auxiliary members 6. Then, it is confirmed that the bottom potions of wafers 1 are fixed in grooves 7 formed on the body of boat-type carrier 2, and the upper portions of wafers 1 are held in grooves 7 formed on wafer holding members 4. After wafers 1 are fixed perfectly between the body of boat-type carrier 2 and wafer holding members 4, fastening members 5 are attached to the boat-type carrier 2. By mounting fastening members 5 in this manner, wafer holding members 4 are secured to boat-type carrier 2 so that, even when boeat-type carrier 2 is immersed into a wet processing tank or a rinsing tank later, wafers 1 do not come out of the boat-type carrier 2, and wet processing or rinsing can be performed in a condition wherein wafers 1 are fixed fully to boat-type carrier 2. A transport robot holds moving robot holding elements 3 and immerses boat-type carrier 2, on which wafers 1 are carried, into a processing tank and a rinsing tank successively. Then, after the wet processing and the rinsing processing of wafers 1 are completed, wafers 1 and boat-type carrier 2 are dried with IPA steam including wafer holding members 4 and fastening members 5. Then, after the drying is ended, fastening members 5 and wafer holding members 4 are removed from boat-type-carrier 2, and then wafers 1 are removed from boat-type carrier 2.

Figure 5:
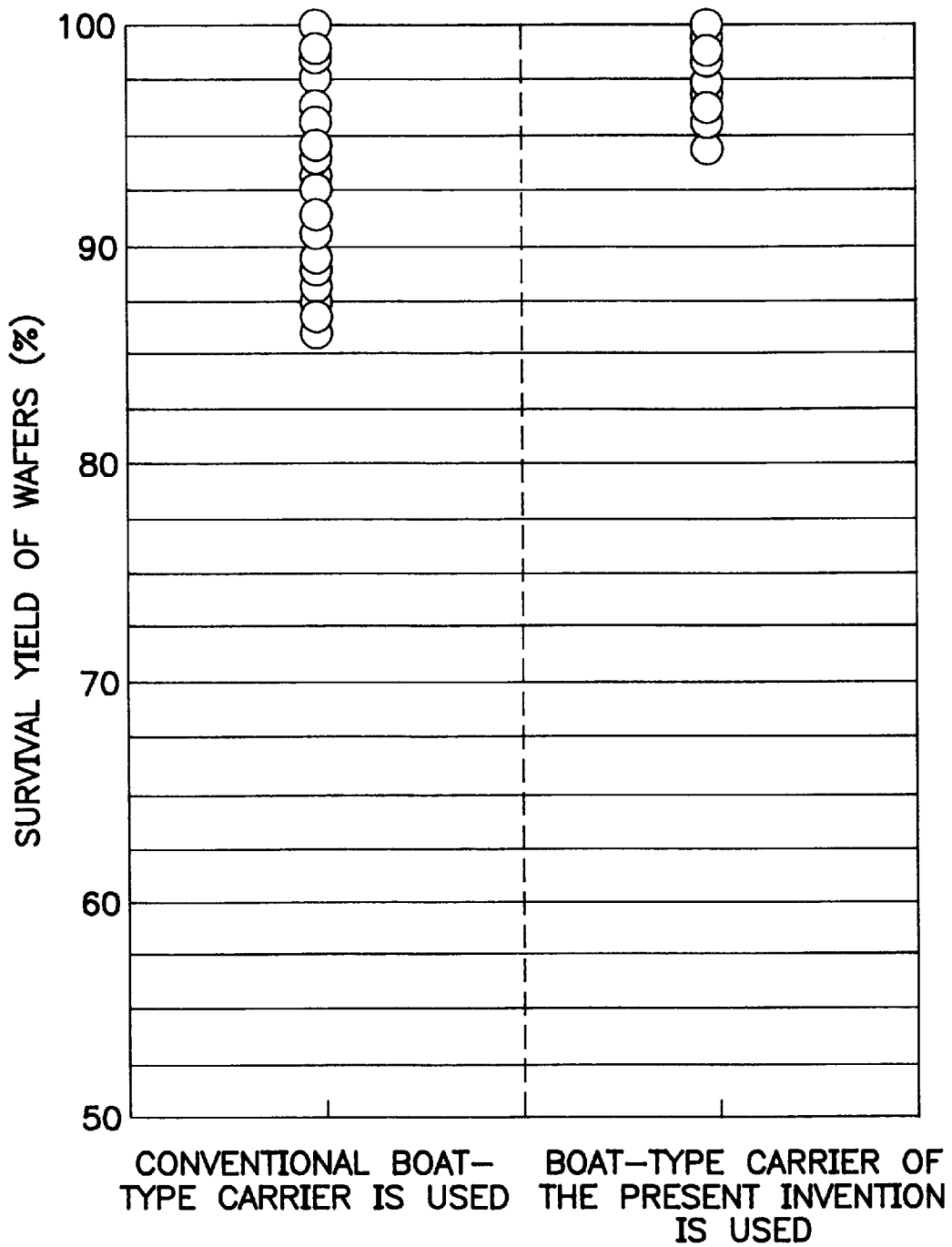
FIG. 5 is a diagrammatic view for comparison between survival yields of wafers when wet processing is performed using a boat-type carrier of the present invention and a conventional boat-type carrier.

As described above, when wet processing is performed using the boat-type carrier according to the present invention, since wafers are prevented from coming out of the grooves of the boat-type carrier and falling down, the breaks of the wafers or the damages to the surfaces of the wafers are reduced remarkably comparing with the conventional methods. Consequently, there is an advantage that the survival yield of wafers is improved very much. FIG. 5 is a graph illustrating comparison between survival diffusion yields when wet processing of wafers is performed using the boat-type carrier of the present invention and a conventional boat-type carrier. Here, the survival yield is a representation of a yield of wafers for each one lot on a semiconductor device production line where the number of wafers for one lot is 25.

What is claimed is:

1. A semiconductor wafer carrier comprising, a boat type carrier having grooves for carrying a plurality of semiconductor wafers loaded in a parallel and aligned relationship with respect to each other, said wafer carrier being adapted to be moved by robot equipment from one processing tank to another processing tank and to immerse the wafer carrier into the tanks together with the semiconductor wafers loaded thereon in order to effect a wet processing of the semiconductor wafers in each of the processing tanks, said wafer carrier comprising:

a carrier body having at least one pair of first holding means provided with a plurality of grooves for holding bottom portions of the semiconductor wafers therein, a second pair of holding means supported from said carrier body for holding down upper portions of the semiconductor wafers loaded on said first holding means, and robot holding means on said wafer carrier for being picked up by said robot equipment for transporting said semiconductor wafer carrier on which said plurality of semiconductor wafers are loaded.

2. A semiconductor wafer carrier as claimed in claim 1, wherein said second holding means has a projection formed between adjacent grooves of said plurality of grooves thereof for accelerating removal of liquid.

3. A semiconductor wafer carrier as claimed in claim 1, wherein the first holding means for holding bottom portions of the semiconductor wafers on the carrier body is in the form of a rod having a circular cross section and has a plurality of grooves for fixing the bottom portions of the semiconductor wafer therein.

4. A semiconductor wafer carrier as claimed in claim 1, wherein said carrier body has a height smaller than the radius of the semiconductor wafers to be carried on said semiconductor wafer carrier and has a width equal to or smaller than the diameter of the semiconductor wafers to be carried on said semiconductor wafer carrier.

5. A semiconductor wafer carrier as claimed in claim 1, wherein said semiconductor wafer carrier and said holding means are made of quartz or a flourine containing resin such as PFA or PTFE.

6. A semiconductor wafer carrier as claimed in claim 1 wherein said second holding member is removable from said carrier body.

7. A semiconductor wafer carrier as claimed in claim 1, wherein said second holding means in the form of a rod having a circular cross section.

8. A semiconductor wafer carrier as claimed in claim 1, wherein said second holding means has a plurality of grooves for fixing the semiconductor wafers therein.

9. A semiconductor wafer carrier as claimed in claim 1, wherein said first holding member is in the form of a rod having a circular cross section.

* * * * *